United States Patent [19]
Sato et al.

[11] Patent Number: 5,877,125
[45] Date of Patent: *Mar. 2, 1999

[54] METHOD OF PREPARING BISMUTH SUPERCONDUCTOR

[75] Inventors: Kenichi Sato; Munetsugu Ueyama, both of Osaka, Japan

[73] Assignee: Sumitomo Electric Industries, Ltd., Japan

[*] Notice: The term of this patent shall not extend beyond the expiration date of Pat. No. 5,610,123.

[21] Appl. No.: 376,461

[22] Filed: Jan. 20, 1995

Related U.S. Application Data

[63] Continuation of Ser. No. 14,073, Feb. 2, 1993, abandoned, which is a continuation of Ser. No. 730,715, Jul. 16, 1991, abandoned.

[30] Foreign Application Priority Data

Jul. 16, 1990 [JP] Japan .................................... 2-188496

[51] Int. Cl.$^6$ .................................... H01L 39/24
[52] U.S. Cl. .................... 505/433; 29/599; 505/492; 505/501; 505/782; 505/928
[58] Field of Search ............... 29/599; 505/430, 505/433, 492, 501, 782, 928

[56] References Cited

U.S. PATENT DOCUMENTS

| | | | |
|---|---|---|---|
| 5,057,486 | 10/1991 | Arendt et al. | 505/1 |
| 5,100,869 | 3/1992 | Masumoto et al. | 505/1 |
| 5,204,316 | 4/1993 | Arendt et al. | 29/599 X |
| 5,610,123 | 3/1997 | Sato et al. | 29/599 X |

FOREIGN PATENT DOCUMENTS

| | | |
|---|---|---|
| 0292385 | 11/1988 | European Pat. Off. . |
| 0310453 | 4/1989 | European Pat. Off. . |
| 0 331 360 | 9/1989 | European Pat. Off. . |
| 0 339 801 | 11/1989 | European Pat. Off. . |
| 0 356 722 | 3/1990 | European Pat. Off. . |
| 0 447 994 A | 9/1991 | European Pat. Off. . |
| WO 89/07087 | 8/1989 | WIPO . |

OTHER PUBLICATIONS

Mimura et al., "Improvement of the critical current density in the silver sheathed Bi–Pb–Sr–Ca–Cu–O superconducting tape", Applied Physics Letters, vol. 54, No. 16, Apr. 17, 1989, pp. 1582–1584.

Kumakura et al., "Bi(Pb)–Sr–Ca–Cu–O superconducting composite tapes prepared by the powder method using an Ag sheath", Applied Physics Letters, vol. 67, No. 7, Apr. 1, 1990, pp. 3443–3447.

Hikata et al., "Electromagnetic Properties and Morphology of Ag–Sheathed Bi–Pb–Sr–Ca–Cu–O superconducting Wires", Japanese Journal of Applied Physics, vol. 28, No. 7, Jul. 1989, pp. L1204–L1206.

Awano et al., "Mechanochemical Effects of Grinding on the Bi–Pb–Sr–Ca–Cu–O Superconductor", Japanese Journal of Applied Physics, vol. 29, No. 2, Feb. 1990, pp. L254–L257.

Kanai et al., "Degradation by Mechanical Grinding and Recovery by Annealing in the Superconducting Phases of the Bi–Pb–Sr–Ca–Cu–O System", Japanese Journal of Applied Physics, vol. 29, No. 3, Mar. 1990, pp. L412–L415.

Jain et al., "Preparation of Highly Oriented Microstructure in the $(Bi, Pb)_2Sr_2Ca_2Cu_3O_x$ Sintered Oxide Superconductors", Japanese Journal of Applied Physics, vol. 29, No. 4, Apr. 1990, pp. L576–L579.

Horiuchi et al., "Phase Transition in Bi–Based Superconductive Oxides Examined by HRTEM", Physica C, vol. 168, Nos. 1 and 2, Jun. 1, 1990, pp. 204–214.

Yamada et al., "Critical currents and flux creep in orientated Bi–Pb–Sr–Ca–Cu–O 110 K phase made by the powder in tube method", Cryogenics, vol. 30, Jul. 1990, pp. 581–585 in combination with vol. 30, May 1990, pp. 385, 388 and 389.

Yamamoto et al., "Effect of the Fabricating Process on the Superconducting Properties of Bi–Pb–Sr–Ca–Cu–O Tapes by the Powder–in–Tube Method", Advances in Superconductivity II, Proceedings of the 2nd International Symposium on Superconductivity (ISS '89), Nov. 14–17, 1989, pp. 419–422.

*Primary Examiner*—Joseph M. Gorski
*Attorney, Agent, or Firm*—Pennie & Edmonds LLP

[57] ABSTRACT

Disclosed herein is a method of preparing a bismuth superconductor including the steps of mixing raw materials for forming a bismuth superconductor with each other to obtain mixed powder, heat treating the mixed powder, pulverizing the mixed powder and then covering the mixed powder with a metal sheath. The mixed powder covered with the metal sheath is prepared to have a 2223 composition in a composition of Bi—Sr—Ca—Cu or (Bi,Pb)—Sr—Ca—Cu and to contain a superconducting phase which is mainly composed of a 2212 phase, and is pulverized into a mean particle diameter of not more than 1 $\mu$m with no conversion of the 2212 phase to an amorphous state.

4 Claims, No Drawings

METHOD OF PREPARING BISMUTH SUPERCONDUCTOR

This application is a continuation of U.S. application Ser. No. 08/014,073, filed Feb. 2, 1993 and now abandoned, which is a continuation of U.S. application Ser. No. 07/730,715, filed on Jul. 16, 1991, and now abandoned.

BACKGROUND OF THE INVENTION

1. Field of the Invention

The present invention relates to a method of preparing a bismuth superconductor, and more particularly, it relates to an improvement for increasing the critical current density of a bismuth superconductor and homogenizing properties thereof.

2. Description of the Background Art

In recent years, ceramic superconducting materials, i.e., oxide superconducting materials, have been watched with interest as superconducting materials which exhibit higher critical temperatures.

In particular, yttrium, bismuth and thallium superconducting materials are expected for practical use with high critical temperatures of about 90 K, 110 K and 120 K respectively.

One of conventional methods of preparing oxide superconductors comprises the steps of mixing raw materials for forming an oxide superconductor with each other, heat treating the mixture, pulverizing the mixture, and thereafter covering the mixture with a metal sheath. This method is advantageously applied to preparation of a long superconducting wire, for example.

A superconductor to be applied to a cable or a magnet, for example, must have a high critical current density, in addition to a high critical temperature. In particular, it is necessary to ensure a required critical current density under a magnetic field which is applied to the superconductor. Further, properties such as the critical current density must be homogeneously attained over the superconductor. In a long superconducting wire, for example, such properties must be undispersed along its longitudinal direction.

However, a conventional oxide superconductor exhibits a rather insufficient critical current density particularly under a magnetic field, and has only unsatisfactory homogeneity of properties.

SUMMARY OF THE INVENTION

The present invention is directed to a method of preparing an oxide superconductor, particularly a bismuth superconductor, and its object is to provide a method of preparing a bismuth superconductor, which is capable of improving the critical current density particularly under a magnetic field, as well as homogenizing properties.

The present invention is directed to a method of preparing a bismuth superconductor, which comprises the steps of mixing raw materials for forming a bismuth superconductor with each other to obtain mixed powder, heat treating the mixed powder, pulverizing the mixed powder, and then covering the mixed powder with a metal sheath. In order to solve the aforementioned technical problem, the mixed powder to be covered with the metal sheath is prepared to have a 2223 composition in a composition of Bi—Sr—Ca—Cu or (Bi,Pb)—Sr—Ca—Cu and to contain a superconducting phase which is mainly composed of a 2212 phase, and is pulverized into a mean particle diameter of not more than 1 $\mu$m with no conversion of the 2212 phase to an amorphous state.

Preferably, the mixing step is carried out in a grinding system.

The pulverizing step is preferably carried out with a dry or wet ball mill, or an attriter.

Preferably, steps of performing deformation processing and heat treatment are further carried out after the step of covering the mixed powder with a metal sheath.

The inventors have studied a bismuth superconductor, to recognize the following facts: A bismuth superconductor contains phases exhibiting critical temperatures of 110 K and 80 K respectively. The 110 K phase has a 2223 composition in a composition of Bi—Sr—Ca—Cu or (Bi,Pb)—Sr—Ca—Cu with partial substitution of Bi for Pb, while the 80 K phase has a 2212 composition in the same composition. In such a bismuth superconductor, a 2223 phase, which is the 110 K phase, has a longitudinally oriented a-b plane as a matrix, while a superconducting phase mainly composed of a 2212 phase, which is the 80 K phase, and/or non-superconducting phases are dispersed along the a-b plane of the 2223 phase. Such dispersions of 2212 phase and non-superconducting phases extremely improves the critical current density and the magnetic field property thereof.

According to the present invention, the powder to be covered with the metal sheath is prepared to have a 2223 composition and to contain a superconducting phase which is mainly composed of a 2212 phase, and is pulverized into a mean particle diameter of not more than 1 $\mu$m with no conversion of the 2212 phase to an amorphous state. Therefore, it is possible to homogeneously obtain an oxide superconductor having the aforementioned structure.

Thus, according to the present invention, it is possible to obtain a bismuth superconductor which is extremely improved and homogenized in critical current density and magnetic field property. Such a bismuth superconductor can be practically applied to a cable or a magnet.

When the mixing step included in the present invention is carried out in a grinding system, it is possible to microscopically mix the raw materials with each other, thereby easily homogenizing the mixed powder. In the grinding system, the materials are not smashed into pieces but crushed under a high pressure.

When the pulverizing step included in the present invention is carried out with a dry or wet ball mill or an attriter, it is possible to easily obtain a mean particle diameter of not more than 1 $\mu$m.

Further, the steps of performing deformation processing and heat treatment are effectively carried out after the step of covering the mixed powder with a metal sheath, in order to attain a high critical current density.

DESCRIPTION OF THE PREFERRED EMBODIMENTS

A method of preparing a bismuth superconductor according to the present invention is now described in more detail.

Raw materials such as oxides or carbonates for forming a bismuth superconductor are mixed with each other, and this mixture is heat treated, pulverized and covered with a metal sheath.

The raw materials are preferably mixed in a grinding system of crushing the same under a high pressure, to be homogeneously mixed with each other.

The mixed powder of the raw materials obtained in the grinding system is heat treated at a temperature which is responsive to the heat treatment atmosphere. This heat treatment is carried out in order to calcine the mixed powder.

Such heat treatment is repeated a plurality of times in general, and the mixed powder is pulverized after each heat treatment.

After the target heat treatment is carried out, the mixed powder is pulverized into a mean particle diameter of not more than 1 μm. At this time, a dry or wet ball mill or an attriter is used to obtain such a submicron mean particle diameter. The maximum particle diameter is preferably not more than 2 μm. The particle diameter is so adjusted that it is possible to finely disperse inavoidably formed non-superconducting phases interdependently with the afore-mentioned homogeneous mixing. Thus, it is possible to attain homogeneous properties in the as-formed bismuth superconductor.

It has been recognized that the 2212 phase is converted to an amorphous state if the pulverizing step is carried out for an excess time in order to finely pulverize the mixed powder. Such a phenomenon exerts a bad influence on the properties of the as-formed bismuth superconductor. If the 2212 phase is converted to an amorphous state, the critical current density cannot be improved since no transformation to a 2223 phase is attained even if heat treatment is thereafter performed. To this end, it is possible to obtain a bismuth superconducting wire having a high critical current density by covering mixed powder of raw materials, which is finely pulverized into a mean particle diameter of not more than 1 μm with no conversion of a 2212 phase to an amorphous state, and performing drawing, rolling and heat treatment, for example, on the mixed powder in this state.

The metal sheath may be formed of any material so far as the same is unreactive with superconducting materials and has excellent workability. For example, the metal sheath is prepared from silver, a silver alloy, gold, or a gold alloy. Alternatively, only a surface, which is brought into contact with the superconducting material, of the metal sheath may be covered with a layer of such a metal. Further, the metal sheath preferably serves as a stabilizer under conditions for using the bismuth superconductor.

In order to obtain a superconducting wire, the mixed powder of raw materials is covered with a metal sheath and subjected to drawing, rolling and heat treatment, for example, as hereinabove described. After such drawing, rolling and heat treatment, the mixed powder is preferably subjected to rolling and/or drawing and heat treatment again, in order to attain excellent properties. The components of the raw materials may be adjusted so that the 2212 phase as well as the non-superconducting phases remain at this time. It has been recognized that a bismuth superconductor having excellent properties can be obtained by heat treating the mixed powder at a temperature which is slightly higher than that for dominantly forming the 2223 phase.

As to the heat treatment, the optimum temperature is selected in response to the heat treatment atmosphere. When the oxygen partial pressure is reduced, for example, the heat treatment is performed at a temperature which is lower than an ordinary one.

The aforementioned deformation processing such as drawing or rolling has an effect of improving the critical current density. In order to improve the critical current density, the drawing as well as rolling are preferably per-formed at a degree of at least 80%. Each of the steps of performing deformation processing and heat treatment is preferably repeated a plurality of times, in order to further improve the critical current density. When rolling is per-formed a plurality of times, for example, the degree is preferably at least 40% every single pass. If rolling or drawing is again performed after the heat treatment, a degree of 10 to 30% may be sufficient this time. The rolling is performed with a roll or a press, for example.

In the bismuth superconductor obtained in the aforementioned manner, the 2223 phase has a longitudinally oriented a-b plane, while the 2212 phase and/or the non-superconducting phases are oriented along the a-b plane. Thus, the bismuth superconductor has an excellent magnetic field property of critical current density.

Experimental Examples carried out according to the present invention are now described.

EXPERIMENTAL EXAMPLE 1

$Bi_2O_3$, PbO, $SrCO_3$, $CaCO_3$ and CuO were blended so that Bi, Pb, Sr, Ca and Cu were in the composition ratios 1.89:0.41:2.01:2.23:3.03. This blend was mixed in a grinding system for 1 hour to obtain mixed powder.

Then the mixed powder of the raw materials was heat treated at 700° C. for 12 hours, at 800° C. for 8 hours and at 855° C. for 8 hours in this order. The mixed powder was pulverized after every heat treatment.

This powder was further pulverized with a ball mill for 10 hours, to obtain submicron powder.

The submicron powder was degassed in a decompressed atmosphere of 6 Torr at 700° C. for 50 minutes.

This powder was mainly composed of a 2212 phase, and contained non-superconducting phases. The non-superconducting phases were composed of (Ca,Sr)—Pb—O, Sr—Ca—Cu—O and Ca—Cu—O.

The powder was charged in a silver pipe of 12 mm in outer diameter, which in turn was drawn into a diameter of 1 mm and further rolled into a thickness of 0.18 mm.

Then the pipe was heat treated at 845° C. for 50 hours, again rolled into a thickness of 0.15 mm, and further heat treated at 840° C. for 50 hours.

The as-formed tape-type wire exhibited a critical current density of 58000 $A/cm^2$ at the liquid nitrogen temperature. When a magnetic field of 1 T was applied, the tape-type wire exhibited a critical current temperature of 19000 $A/cm^2$.

Comparative example was prepared under similar conditions to the above, except for that the mixed powder was pulverized with a ball mill for 50 hours to convert the 2212 phase to an amorphous state.

The as-formed tape-type wire exhibited a low critical current density of 18000 $A/cm^2$. When a magnetic field of 1 T was applied, the critical current density was extremely reduced to 2000 $A/cm^2$.

EXPERIMENTAL EXAMPLE 2

Mixed powder to be pulverized with a ball mill was prepared similarly to Experimental Example 1.

This powder was pulverized with a ball mill for 10 hours. On the other hand, similar powder was pulverized for 50 hours, in order to prepare comparative example.

Each powder was degassed and charged in a silver pipe, which in turn was drawn, rolled into a thickness of 0.18 mm, and heat treated, similarly to Experimental Example 1.

According to Experimental Example 2, the as-formed tape-type wire exhibited high and homogeneous critical current densities of 23000 $A/cm^2$ and 28000 $A/cm^2$ in different positions. On the other hand, the tape-type wire according to comparative example exhibited low and significantly dispersed critical current densities of 3000 $A/cm^2$ and 7000 $A/cm^2$ in different positions.

What is claimed is:

1. A method of producing a bismuth superconductor wire, comprising the steps of:

mixing together raw materials for forming a bismuth superconductor, thereby obtaining a mixture of raw materials;

heat treating said mixture of raw materials, thereby obtaining a mixed powder having mainly a 2212 phase in a crystal state and non-superconducting phases;

pulverizing said mixed powder to a mean particle diameter of not more than 1 $\mu$m, thereby maintaining the crystal state of said 2212 phase without any conversion of said 2212 phase to an amorphous state; then degassing said mixed powder;

covering said mixed powder with a metal sheath, thereby forming a bismuth superconductor composite; and plastically deforming said bismuth superconductor composite, thereby reducing the cross-sectional area thereof; and heat treating said bismuth superconductor composite, thereby transforming a first part said 2212 phase and non-superconducting phases into a 2223 superconducting phase having as a matrix a longitudinally oriented a-b plane with a second part of said 2212 phase and non-superconducting phases dispersed along said a-b plane.

2. A method of producing a bismuth superconductor wire in accordance with claim 1, wherein said mixing step is grinding raw materials.

3. A method of producing a bismuth superconductor wire in accordance with claim 1, wherein said pulverizing step is ball milling said mixed powder.

4. A method of producing a bismuth superconductor wire in accordance with claim 1, wherein said pulverizing step is attriting said mixed powder.

* * * * *